(12) United States Patent
Rohrmoser et al.

(10) Patent No.: US 7,119,421 B2
(45) Date of Patent: Oct. 10, 2006

(54) QUAD FLAT NON-LEADED PACKAGE COMPRISING A SEMICONDUCTOR DEVICE

(75) Inventors: Bernd Rohrmoser, Boenningstedt (DE); Thomas Weiss, Hamburg (DE)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 10/516,647

(22) PCT Filed: Jun. 4, 2003

(86) PCT No.: PCT/IB03/02094

§ 371 (c)(1),
(2), (4) Date: Dec. 1, 2004

(87) PCT Pub. No.: WO03/105223

PCT Pub. Date: Dec. 18, 2003

(65) Prior Publication Data

US 2005/0173793 A1    Aug. 11, 2005

(30) Foreign Application Priority Data

Jun. 6, 2002    (EP) .................................. 02012603

(51) Int. Cl.
*H01L 23/495* (2006.01)
(52) U.S. Cl. ...................................... 257/666; 257/676
(58) Field of Classification Search ................ 257/666, 257/676
See application file for complete search history.

(56) References Cited

U.S. PATENT DOCUMENTS

| | | | |
|---|---|---|---|
| 6,201,292 B1 | 3/2001 | Yagi | |
| 6,483,178 B1 * | 11/2002 | Chuang | 257/672 |
| 6,767,753 B1 * | 7/2004 | Huang | 438/25 |
| 2002/0027273 A1 | 3/2002 | Huang | 257/678 |
| 2002/0063257 A1 | 5/2002 | Wang | |
| 2002/0119603 A1 | 8/2002 | Tani | |

FOREIGN PATENT DOCUMENTS

| | | |
|---|---|---|
| EP | 0 794 572 A2 | 9/1997 |
| JP | 10313082 | 11/1998 |

\* cited by examiner

*Primary Examiner*—Roy Potter
(74) *Attorney, Agent, or Firm*—Aaron Waxler; Paul Im

(57) ABSTRACT

A semiconductor package is proposed. The semiconductor package includes a discrete semiconductor chip on a die pad, a plurality of bond pads situated next to the chip and formed with a plurality of connecting mechanisms and an encapsulant for encapsulating the chip and the pads. In a preferred embodiment the die pad and/or the bond pads comprise means for vertically and laterally interlocking the pads to the encapsulant. The interlocking means of the bond pads and the die pad significantly enhance the bonding strength between the pads and the encapsulant for preventing delamination or cracking, so that quality and reliability of the quad flat non-leaded semiconductor package comprising a discrete can be assured.

5 Claims, 5 Drawing Sheets

QUAD FLAT NON-LEADED PACKAGE COMPRISING A SEMICONDUCTOR DEVICE

The present invention generally relates to a quad flat non-leaded leadframe package structure for housing a semiconductor device. More particularly, the present invention relates to a quad flat non-leaded leadframe package structure for housing a discrete semiconductor device.

One of the major trends in the semiconductor packaging industry is to use surface-mount technology (SMT) as a replacement for conventional plated-through-hole (PTH) technology. SMT offers several distinct advantages over PTH technology, such as greater packaging density, higher lead counts with shorter interconnection lengths and easier automation. Since SMT requires electronic devices and components to be mountable on the surface of a printing wiring board, the materials and structure of traditional leaded components including capacitors, resistors and inductors have to be redesigned to meet the modern-day demand for short, thin, light and small electronic devices.

Examples of semiconductor devices accomplishing these objects include "Quad flat non-leaded (QFN)" packages. Quad flat non-leaded electronic devices have a relatively new package structure, in which space-consuming outer leads protruding laterally out of a package are eliminated. Instead, external electrode pads to be electrically connected to a motherboard are provided on the backside of the QFN package.

A quad flat non-leaded package, especially a leadless leadframe package (LLP) makes use of a metal leadframe-type substrate structure in the formation of a chip scale package (CSP). In a typical leadless leadframe package, a copper leadframe strip or panel is patterned by stamping or etching to define a plurality of arrays of chip substrate features. Each chip substrate feature includes a die attach pad and a plurality of contacts (bonds) disposed about their associated die attach pad.

During assembly, dice are attached to the respective die attach pads and conventional wire bonding is used to electrically couple each die to their associated bond pad contacts on the leadframe strip. After the wire bonding process, a synthetic resin cap is moulded over the top surface of each array of wire-bonded dice. The dice are then singulated and tested using conventional sawing and testing techniques.

The resulting packaged chip can then be surface mounted on a printed circuit board or other substrate using conventional techniques.

It should be appreciated that during singulation, the only materials holding the die pads and the bond pad contacts in place is the molding material. Due to lack of adequate support or clamping force during singulating the encapsulant, the die pad or the leads tend to be dislocated during singulation.

U.S.20020027273A1 discloses a semiconductor package that includes a semiconductor chip; a plurality of leads surrounding the chip and formed with a plurality of connecting mechanisms and strengthening structures; and an encapsulant for encapsulating the chip and the leads. The leads have the same height as the semiconductor package, allowing upper and lower surfaces of the leads to be exposed to the outside of the encapsulant, and further enhance the dissipation of heat generated by the chip in operation. The strengthening structures of the leads significantly enhance the bonding strength between the leads and the encapsulant for preventing delamination or cracking, so that quality and reliability of the semiconductor package can be assured.

Such a leadless leadframe package, however, has the following drawbacks. The invention makes use of lead frames having a plurality of leads extending inwardly from a frame of the lead frame, wherein the leads are formed with strengthening structures on sides thereof, and connecting mechanisms are on surfaces of inner sides of the leads. Such a lead frame structure is not suitable for commodity products such as individually packaged discrete semiconductor devices.

It is therefore an object of the present invention to provide an improved quad flat non-leaded leadframe semiconductor package especially useful for individually packaged discrete semiconductor devices.

Another object of the invention is to provide a quad flat non-leaded leadframe semiconductor package for improving the connection reliability at the time of packaging.

Yet another object of the invention is to provide a quad flat non-leaded leadframe semiconductor package intended to facilitate the process management.

In accordance with the foregoing and other objectives, the quad flat non-leaded semiconductor device proposed in the invention comprises:

a discrete semiconductor die;

a die pad having a first lateral surface for supporting the discrete semiconductor die; and a plurality of vertical surfaces that are perpendicular to the first lateral surface, at least one bond pad having a first lateral surface and a plurality of vertical surfaces that are perpendicular to the first lateral surface;

at least one bond wire for connecting the discrete semiconductor die to the bond pad; and an encapsulant for encapsulating the die, die pad, bond wire and bond pad having lateral and vertical outer surfaces, wherein the die pad is disposed at the perimeter of the encapsulant and partially exposed to one vertical outer surface of the encapsulant.

In one embodiment of the invention, a vertical surface of the die pad is provided with interlocking means.

In a preferred embodiment of the invention, a vertical surface of the die pad is provided with means for interlocking the die pad vertically and laterally.

In another preferred embodiment of the invention, a first and a second vertical surface of at least one die pad is provided with interlocking means.

In still another embodiment of the invention, a vertical surface of a bond pad is provided with interlocking means.

These and other features and advantages of the present invention will be apparent to those skilled in the art from the following detailed description and drawings.

Figure 5:
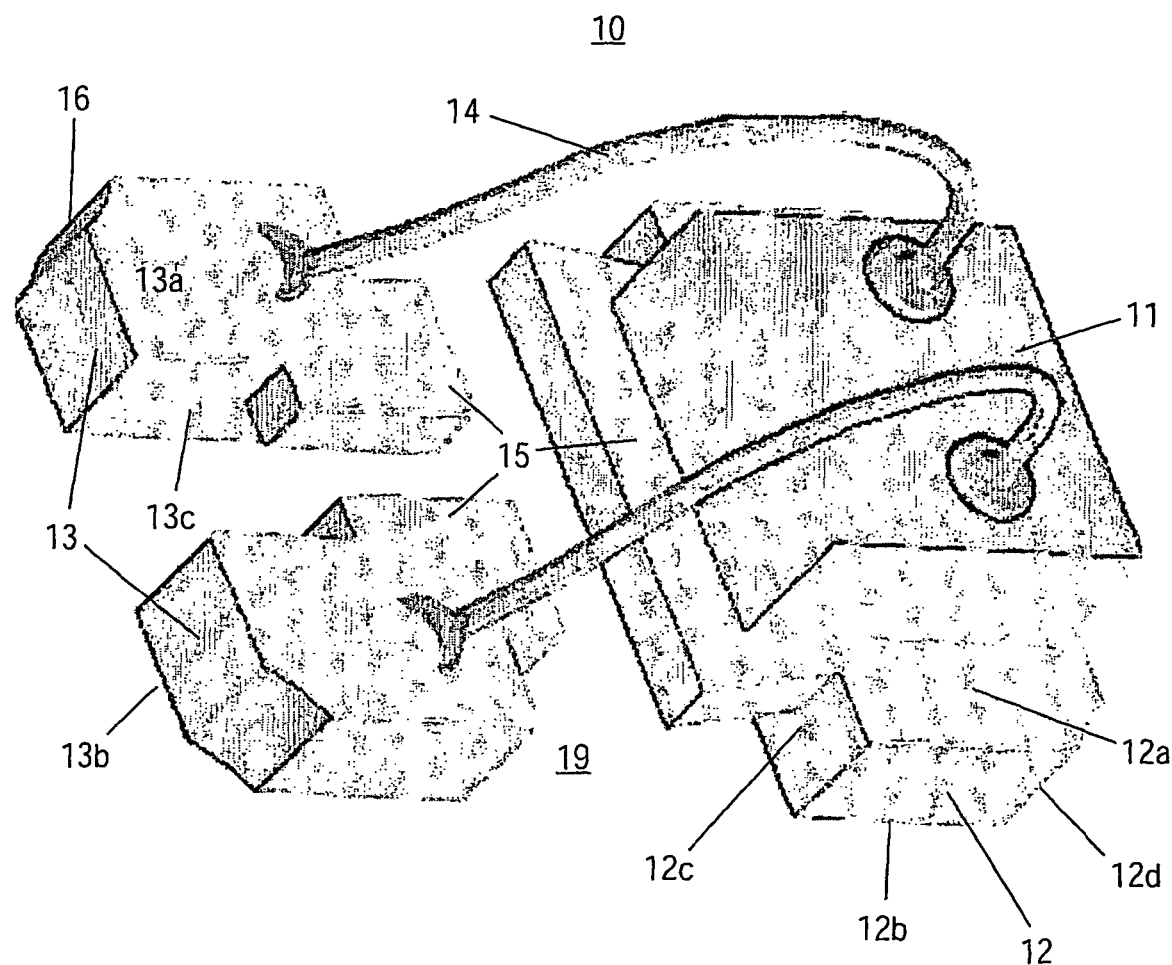
FIG. 5 is a perspective view of the QFN package according to one embodiment of the invention.

A quad flat non-leaded semiconductor package 10, as illustrated in FIG. 5, includes the following members:

a semiconductor chip 11;

a die pad 12 having a base body with a first lateral face 12a for attaching the chip 11, a second lateral face 12b exposed to the outside of the encapsulant for external electrical connections and vertical faces 12c, 12d;

two bond pads 13 disposed next to the die pad 12 and electrically connected to the chip 11; and an encapsulant 19 for encapsulating the chip 11, the die pad 12, and the bond pads 13. The bond pads 13 each have a first lateral face 13a, a second lateral face 13b which is exposed to the outside of the encapsulant 19 for external electrical connections, and is coplanar with the second lateral face of the die pad 12b. The second lateral faces of die pad and bond pad 12b, 13b may serve as I/O terminals for electronic transmission so as to electrically connect the semiconductor package 10 to a substrate such as an external printed circuit board (not shown).

The package furthermore comprises a plurality of bond wires 14, each bond wire being connected between a conductive contact on the discrete semiconductor die and a first surface of a bond pad.

The package furthermore comprises an encapsulant material 19, which forms a package body.

The package has a polyhedral shape with peripheral side faces and edges. One lateral peripheral face comprises the second lateral faces of die pads and bond pads.

The package has a perimeter, and the discrete semiconductor device is placed at the perimeter of the package. At least one vertical face of the die pad is at least partially exposed to an external surface of the package.

Figure 1:
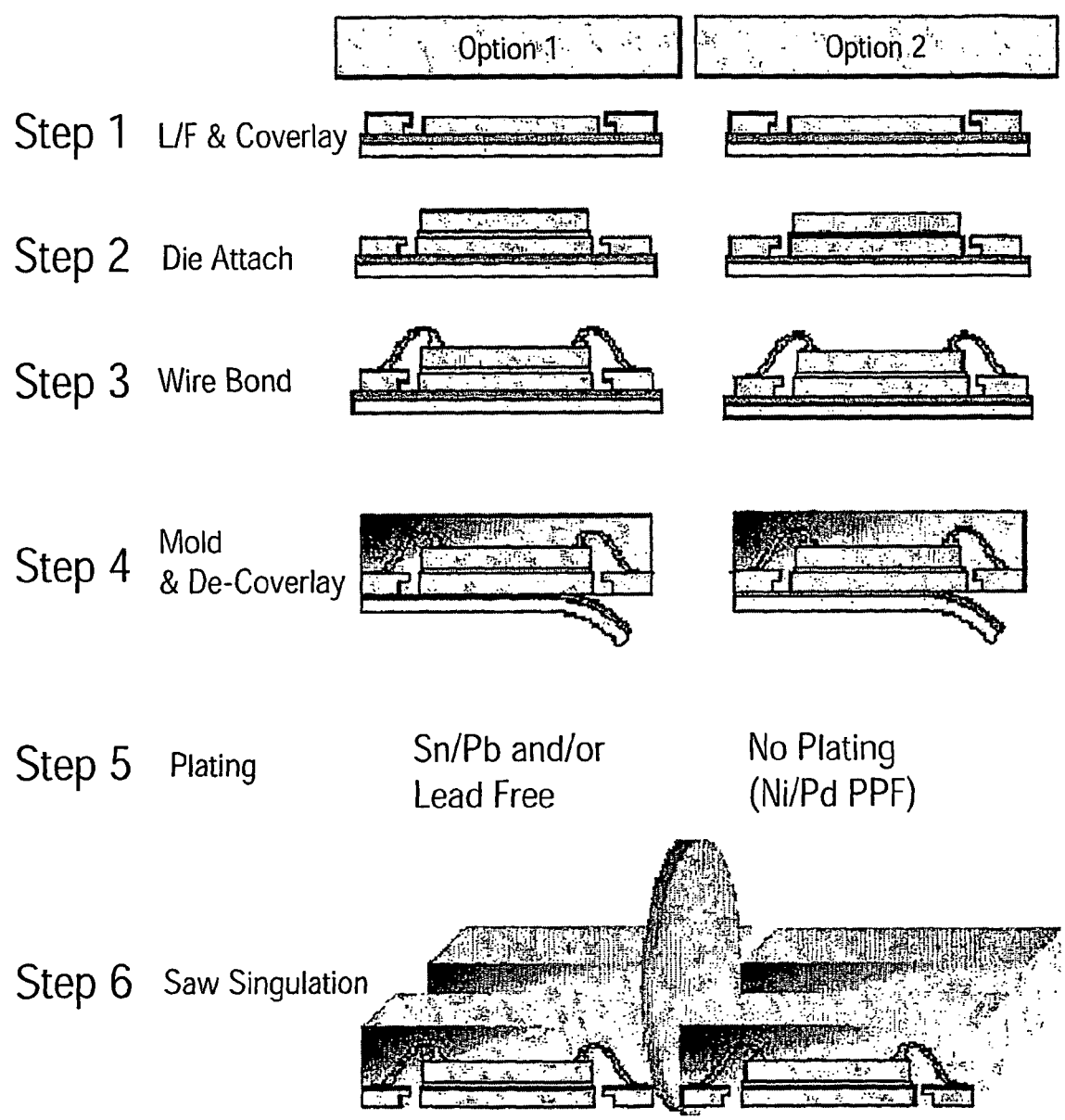
FIG. 1 shows two options for process steps to be performed for manufacturing a QFN package comprising discrete semiconductor devices.

Two methods of manufacturing a Quad Flat Non-leaded Leadframe Package are shown in FIG. 1. For making a Quad Flat Non-leaded Leadframe Package use is made of a metal lead frame. Such a metal frame may also include a coverlay. A plurality of die pads and bond pads is present within and connected to the frame. Dice are attached to the respective die attach pads and conventional wire bonding is used to electrically couple each die to their associated bond pad contacts on the leadframe strip. After an encapsulation step comprising moulding and removing the coverlay, the die pads and leads may be plated. Thereafter the die pads and bond pads are severed from the leadframe and completed packages are sawn from the leadframe. A plurality of packages, e.g. several thousand, may be made simultaneously.

The discrete semiconductor device as used for the present invention is preferably an active or passive discrete electronic device such as a transistor, diode, LED, resistor, capacitor and inductor incorporated in a chip (die).

A die pad is used for supporting the discrete semiconductor device chip (die) present thereon and disposed in a perimeter region of the encapsulant.

Such a die pad has a base body shaped as a polyhedron. The basic body shape is usually derived from a cuboid and will be described as such in the following. Yet it should be understood that the cuboid shape can have deviations from the regular cuboid shape, e.g. recesses, grooves and other deviations.

The die pad has a first substantially planar lateral surface 12a upon which a die 11 is placed during package assembly.

Opposite the first surface is a substantially planar second lateral surface 12b that is peripheral with regard to the surface of the package. The second lateral surface of the die pad 12 is located within substantially the same plane as the lower surface of the resin encapsulant 19, and exposed without being covered with the resin encapsulant.

Furthermore, the die pad comprises a plurality of vertical faces, extending perpendicularly to the lateral faces. A first lateral surface 12d is peripheral with regard to the surface of the package. According to the singulating technique used to singulate individual packages, first lateral face 12d may be wholly or partially exposed to the outer surface of the package. For example, the first vertical side integrally faces an outside surface of the encapsulant or it has a lid pointing to an outer surface of the encapsulant.

In a preferred embodiment of the invention, at least one inner lateral face is provided with interlocking means, especially means for laterally and vertically interlocking means for safely anchoring the die pad in the encapsulant. Preferably interlocking means are provided to the rear face of the first lateral face.

Such interlocking means may comprise protrusions provided with surfaces that have a re-entrant angle in one direction. Such protrusions that have a re-entrant angle in one direction may comprise a circular lid being cantilevered to all vertical faces of the die pad.

In a preferred embodiment such interlocking means may comprise protrusions provided with surfaces that have a re-entrant angle in at least two directions.

Such protrusions having a re-entrant angle in at least two directions may comprise open-ended or closed trapezoids, dovetails, T-shaped protrusions, anchor-shaped protrusions, horn-shaped protrusions or a lid pointing outwards to an inner surface of the encapsulant.

Protrusions need not be symmetrical—as in barb-shaped protrusions.

Such interlocking protrusions may have a stepped profile.

Protrusions on two sides may work together to laterally and vertically interlock the die pad into the encapsulant.

Figure 4:
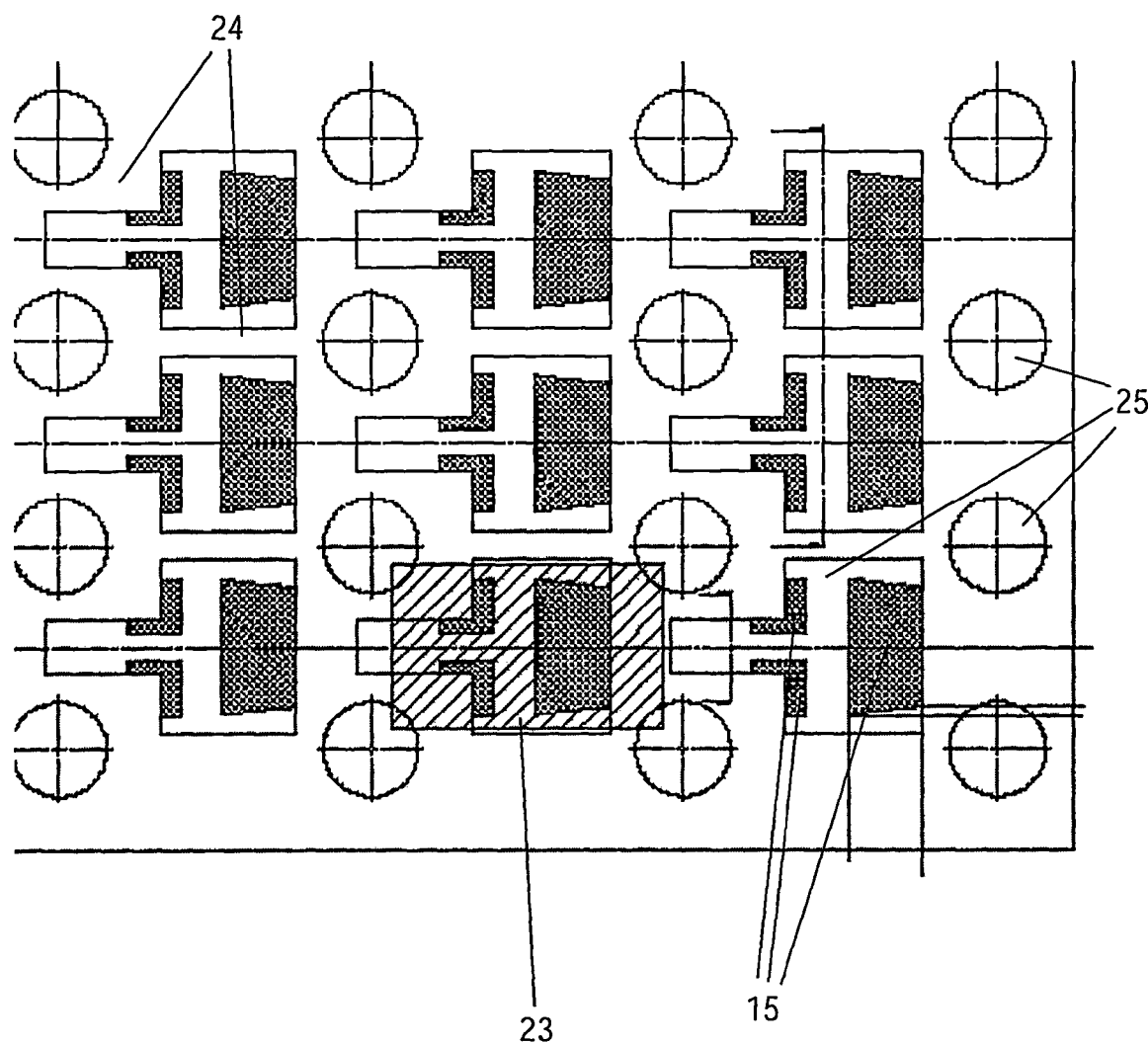
FIG. 4 shows a cross-sectional view illustrating interlocking means of die pads and bond pads according to one embodiment of the invention.

FIGS. 4 and 5 illustrate a die pad with interlocking means formed as a dovetail.

As viewed from above, the inner rear surface of the die pad is arranged like a cantilever lip with a dovetail protrusion.

More specifically, the protrusion of the die pad protrudes inward, and the first lateral surface of the die pad is greater in area than the second surface thereof. In FIG. 4, the hatched area indicates the device area, the cross-hatched regions indicate the half-etched portions of the die pads (and bond pads).

Besides protrusions, grooves could also be contemplated as interlocking means. Such a groove surrounds the vertical faces and may be circular, rectangular or any other complex shape.

Also as shown in FIGS. 4 and 5, for example, at least longitudinal grooves 16 running the full length, or part of the length, of the body perimeter edges might be useful.

Also, each of the bond pads 13 may be provided with interlocking means to cushion the forces causing delamination.

Bond pads are used for electrically connecting the discrete semiconductor chip device (die) to outside electrodes.

Such bond pads have a polyhedron-shaped base body. The basic body shape is usually derived from a cuboid and will be described as such in the following. Yet it should be understood that the cuboid shape can have e.g. recesses, grooves and other deviations from the regular cuboid shape.

The bond pads have a first substantially planar lateral surface 13a upon which bond wires 14 are placed during package assembly.

Opposite the first surface is a substantially planar second lateral surface 13b that is peripheral with regard to the surface of the package. The second lateral surface of the die pad 12 is located within substantially the same plane as the lower surface of the resin encapsulant 19, and exposed without being covered with the resin encapsulant.

Furthermore, the bond pads comprise a plurality of vertical faces extending perpendicularly to the lateral faces. A first lateral surface 13d is peripheral with regard to the surface of the package. According to the singulating technique used to singulate individual packages, first lateral face 13d may be wholly or partially exposed to the outer surface of the package. For example, the first vertical side integrally faces an outside surface of the encapsulant or it has a lid pointing outward to an outer surface of the encapsulant.

In a preferred embodiment of the invention, at least one inner lateral face of each bond pad is provided with interlocking means, especially means for laterally and vertically interlocking means for safely anchoring bond pads in the encapsulant. Preferably, interlocking means are provided to the rear face of the first lateral face.

Such interlocking means may comprise protrusions provided with surfaces that have a re-entrant angle in one direction. Such protrusions that have a re-entrant angle in one direction may comprise a circular lid being cantilevered to all vertical faces of the bond pad.

In a preferred embodiment, such interlocking means may comprise protrusions provided with surfaces that have a re-entrant angle in at least two directions.

Such protrusions having a re-entrant angle in at least two directions may comprise open-ended or closed trapezoids, dovetails, T-shaped protrusions, anchor-shaped protrusions, horn-shaped protrusions or a lid pointing outward to an inner surface of the encapsulant.

Protrusions need not be symmetrical such as, for example, in barb-shaped protrusions.

Such interlocking protrusions may have a stepped profile.

Protrusions on two sides may work together to laterally and vertically interlock the bond pads into the encapsulant.

FIGS. 4 and 5 illustrate bond pads with interlocking means on two vertical faces formed as a V-angle.

As viewed from above, the inner rear surfaces of the bond pads are arranged like a cantilever lip with a V-shaped protrusion.

More specifically, the protrusion of the bond pads protrude inward, and the first lateral surface of each bond pad is greater in area than the second surface thereof. In FIG. 4, the hatched area indicates the device area, the cross-hatched regions indicate the half-etched portions of the bond pads.

Besides protrusions, grooves could also be contemplated as interlocking means. Such a groove surrounds the vertical faces and may be circular, rectangular or of any other complex shape.

Also as shown in FIGS. 4 and 5, for example, at least longitudinal grooves 16 running the full length, or part of the length, of the body perimeter edges might be useful.

Figure 3:
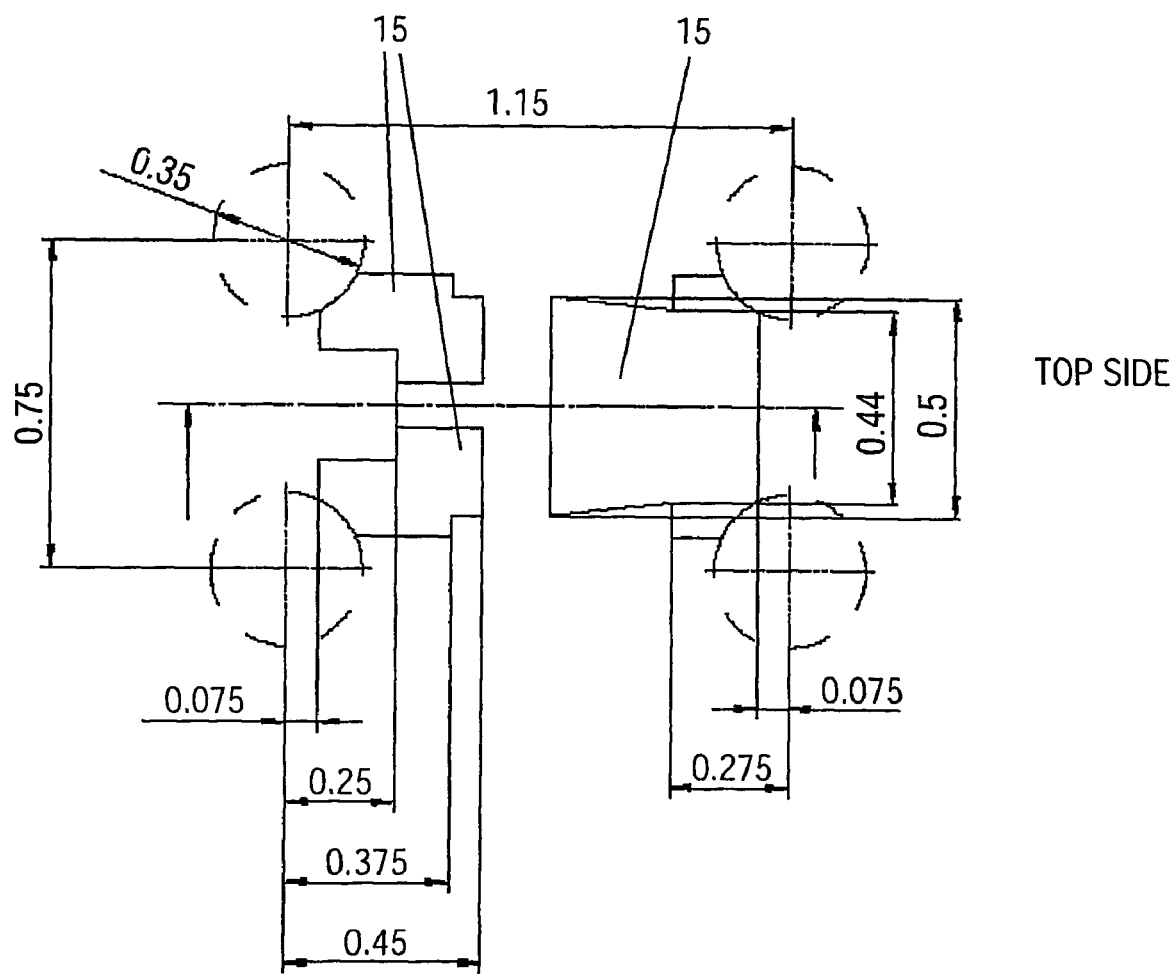
FIG. 3 is a plan view of die pads and bond pads according to an embodiment of the invention.

The number, location and shapes shown in FIG. 3 for protrusions (interlocking means) 15 of leadframe 20 are exemplary only. The number, location and shape of the protrusions will vary according to the application. An advantage of the present invention is that the interlocking means can be designed to accommodate the number and location of the die pads and bonding pad(s) of a particular discrete semiconductor die.

When the semiconductor chip is molded with a resin encapsulant after having been bonded and fixed onto the protruding portion 6 of the die pad 1 with an adhesive, the resin encapsulant is received at the undercuts of interlocking means 15. Accordingly, undercut surfaces of interlocking means interact with the corresponding subfaces of the encapsulant for fixing the members mechanically to the relative subsurface of the package. Thereby, the interlocking means prevent the die pads and bond pads from being pulled vertically or laterally from the package body, thus preventing that the reliability of the resin-molded semiconductor device is adversely affected.

Discrete semiconductor chip dice 11 of a plurality of different sizes can be packaged on the die pad, and the contact area of the semiconductor dice 11 and the die pad can be enlarged e.g. by a trough to improve the contact between the semiconductor die 2 and the die pad, thereby preventing the die pad and the semiconductor chip 11 from being separated.

The semiconductor die 11 may be bonded onto the central portion of the die pad via a gluing process.

Thereafter the dice 11 are electrically connected to associated bond pads 13 with fine metal bond wires 14.

Bonding wires are typically made of gold. When gold bonding wires are used in combination with a copper substrate, it is advantageous to plate contact landings using silver (or another material) to improve the adhesion of the bonding wires to the landings.

After all of the dice have been wire bonded or otherwise electrically connected to the appropriate contact landings, one or more plastic caps 21 are formed over the substrate panel 20 as illustrated in FIG. 1. In the described embodiment, a separate plastic cap is formed over all devices of device areas 23. That is, four separate caps as outlined in dashed lines in FIG. 2a. However, it should be appreciated that a single cap or a different number of caps can readily be provided.

In this case, since the bottoms of the die pad and bond pads are not covered with the resin encapsulant 15, a "single-sidemolded structure" is obtained.

The die pad 12, bond pads 13, semiconductor chip 11 and fine metal wires 14 are encapsulated within the resin encapsulant 19. However, the respective lower parts of the bond pads and die pads around the outer periphery of the package protrude downward and sideward out of the lower surface of the resin encapsulant 19. These lower parts of the pads function as external electrodes (or external terminals) to be electrically connected to a motherboard.

Hereinafter, the effects attainable by the functions of a QFN package according to the invention will be described.

The package of the present invention has numerous advantages, and is useful in numerous applications for discrete electronic devices, including power devices. The package may be made small in size. For example, the packages may be near chip size. In addition, the packages may be very thin. Packages having thickness as low as about 0.5 mm or less can be fabricated according the present invention. In addition, the bond pads can be placed close to the die, minimizing the length of bond wires and improving electrical performance. The exposed second surface of the die pad and bond pads can be connected by metal solder to the printed circuit board for package cooling.

No outer leads exist beside the bond pads and die pads. Instead, the lower part of each of these signal leads 1 functions as the external electrode. Accordingly, such a structure contributes to downsizing of a power QFN package without limiting the size of a semiconductor chip mounted. Moreover, since no resin burr exists on the respective lower surfaces of the external electrodes, the electrodes of the motherboard can be bonded to these external electrodes in a more reliable manner.

Furthermore, since the vertical faces of the pads may have interlocking means for laterally and vertically locking the pads to the encapsulant, pads can cushion the deforming force during machining of the encapsulant. Accordingly, it is possible to prevent the die pad 2 and the bond pads from being deformed or displaced as a result of the machining forces.

It is a further advantage of the invention that tools designed for quad flat non-leaded packaging of integrated circuits can be used without major alterations being necessary.

Figure 2:
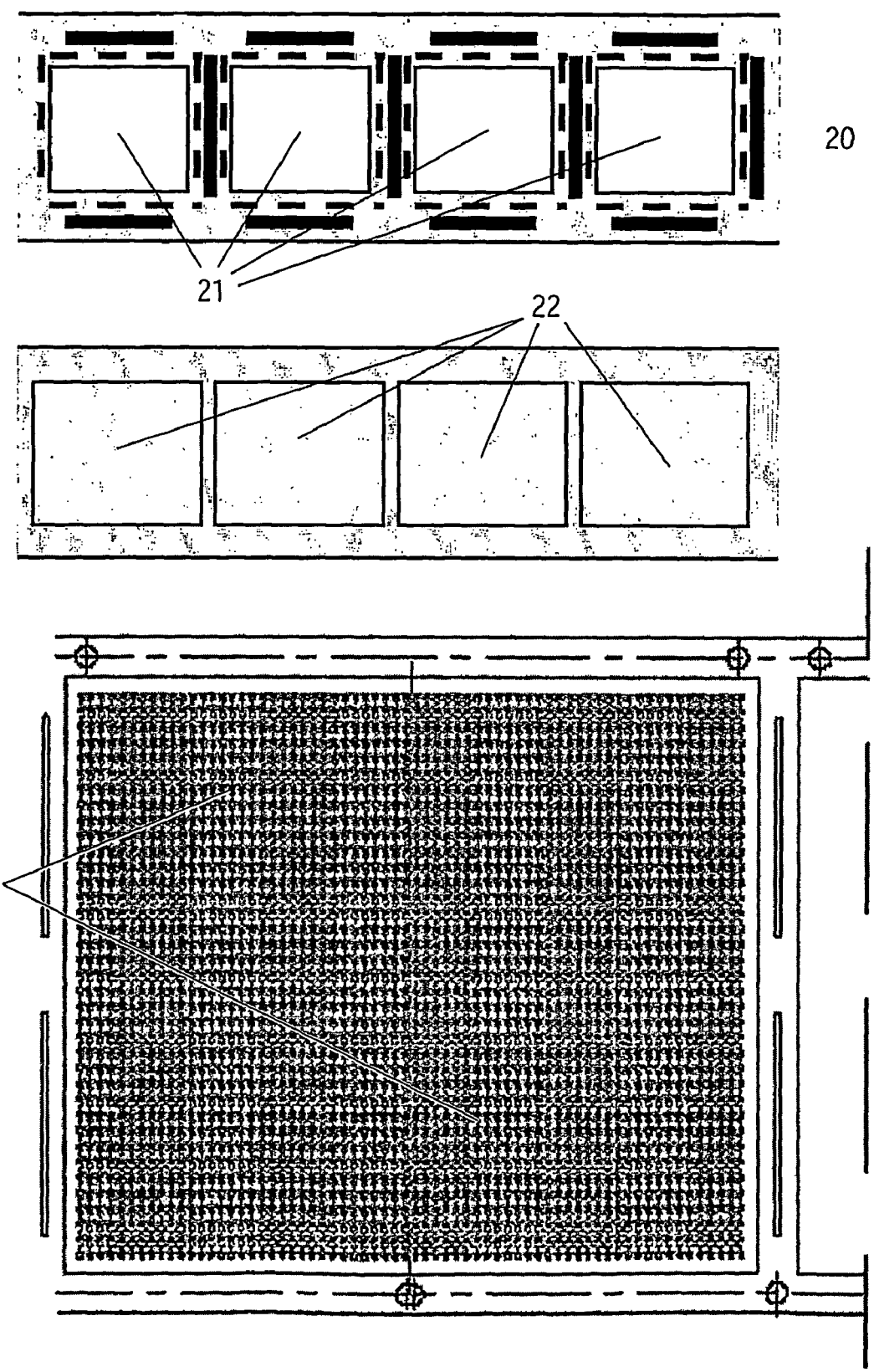
FIG. 2 is a plan view of a leadframe for QFN packages comprising 1944 discretes.

Hereinafter, a method for manufacturing the QFN package comprising a discrete semiconductor device according to the invention will be described with reference to the accompanying drawings. FIGS. 1, 2 and 4 illustrate respective process steps for manufacturing the QFN package according to the first embodiment.

FIGS. 2A and 2B show a schematic plan view of a QFN matrix leadframe 20 used for QFN fabrication; and FIG. 2C shows a schematic sectional view of an unsingulated batch of package units constructed on the QFN matrix leadframe 20.

Referring initially to FIG. 2, a leadless leadframe 20 suitable for use in accordance with one embodiment of the present invention will be described. As seen therein, a conductive panel 21 is provided that has a plurality of segments 22 each having a plurality of device areas 23 for the individual package regions in a plurality of rows and a plurality of columns formed thereon. In the embodiment shown, the conductive panel takes the form of a leadframe strip having a one-dimensional array of device segments. However, in alternative embodiments, conductive panels having a wide variety of different shapes and device area layouts may be provided.

As shown in FIG. 4, the QFN matrix leadframe 20 is predefined with a matrix of package sites 23 used for the fabrication of a batch of QFN package units thereon. These package sites 23 are delimited from each other by grid-like connecting means 24 formed along the borderlines of the package sites 23, and each include a die pad 12 and a plurality of bond pads 13 which are all connected to the grid-like connect bar 24 so that they can be held together before being singulated.

So, a great number of QFNs comprising discrete semiconductor devices can be manufactured from one lead frame.

It has been found helpful to adhere an adhesive tape to the bottom surface of the leadframe strip or panel 101 during the assembly process. The adhesive coverlay tape helps support the die pads and bond pads during the die attach and wire bonding operations, and also prevents flash (i.e. unwanted plastic) from forming on the underside of the leadframe strip or panel 20 during the molding process.

The die pads and bond pads comprising interlocking means 15 as well as saw pits and saw notches 25 in the leadframe may be formed by any suitable process. This is sometimes referred to as a half-etch or partial etch process since the etch is intended to form troughs in the substrate rather than etch completely through the substrate panel 20. A wide variety of conventional etching techniques can be used to facilitate the etching process.

As is well known, chemical etching (also known as chemical milling) is a process that uses photolithography, photoresist, and metal-dissolving liquid chemicals to etch a pattern into a metal strip. Typically, a layer of photoresist is applied to one or both planar surfaces of the strip. Next, the resist layer is exposed to light through a mask having a desired pattern. The photoresist is then developed and cured, forming a patterned photoresist mask. Next, chemicals are sprayed or otherwise applied to one or both planar surfaces of the masked strip. The exposed portions of the strip are etched away, leaving the desired pattern in the metal strip.

A two-step etching process is used to form leadframe 20 of FIGS. 2 and 4. The first etching step serves to etch one or both planar surfaces of the strip according to a resist pattern applied onto one or both of the planar surfaces of the strip. This first etching step etches completely through portions of the metal strip to form the overall pattern of the leadframe, as exemplified in FIG. 2. Next, a second resist pattern is formed on portions of one side of the leadframe. The interlocking means of the die pad, bond pads and saw troughs are not covered by the second resist pattern, and thus are susceptible to further etching. The second etching step etches partially through the leadframe from one side according to the second resist pattern. This second etch step forms the recessed surfaces of leadframe 20, e.g., interlocking means of die pad and bond pads, shown as cross-hatched sections. Saw troughs typically are also subjected to this second etch step. When the chemicals have etched a selected distance through the thickness of selected portions, the second etch step is stopped. In other words, the second etching step etches partially through the thickness of selected portions of the die pad and bond pads. The amount of material etched away in this second etching step is governed by the need to have a sufficient amount of encapsulant material flow beneath the interlocking means of die pad and bond pads to secure die pad and bond pads to the package body. Typically, the second etching step removes about 50% of the thickness of the die pad and bond pads, but the amount removed may range from about 33% to 75% of the thickness of the die pads and bond pads. Due to imperfections in the etch process, re-entrant angles may not be orthogonal, but rather only substantially orthogonal, and the etched sidewalls of die pad and bond pad may not be planar, but rather possess radiused corners.

After the leadframe panel 20 has been patterned, it may optionally be plated with a material that facilitates better wire bonding. The leadframe 20 may be plated with metal layers of nickel (Ni), palladium (Pd) and gold (Au), either at this point in time or after the moulding process step.

After said optional plating of the die pads, discrete semiconductor dice 11 are mounted on the die pads 12 using conventional die attachment techniques.

In the process step 2 shown in FIG. 1, the semiconductor chip 4 is mounted on the central portion of the die pad in the leadframe 20 prepared and bonded by means of gluing with silver paste containing an epoxy resin as a binder. This process step is referred to as "die bonding".

Then, in the process step 3 shown in FIG. 1, the electrode pads (not shown) of the discrete semiconductor chip 11 are electrically connected to the bond pads 13 with the fine metal wires or an equivalent conductor 14. This process step is referred to as "wire bonding". The fine metal wires 14 may be made of an appropriately selected material such as aluminium (Al) or gold (Au).

After all of the dice have been wire bonded or otherwise electrically connected to the appropriate contact landings, one or more plastic caps 22 are formed over the substrate panel 20 as illustrated in FIG. 2B. In the described embodiment, a separate plastic cap is formed over all devices of each device area 23. That is, four separate caps as outlined in dashed lines in FIG. 2A. However, it should be appreciated that a single cap or a different number of caps can readily be provided.

In this case, since the bottoms of the die pad and bond pads are not covered with the resin encapsulant 19, a "single-sidemolded structure" is obtained.

The caps 22 may be formed using any conventional molding process including transfer molding and injection molding. In the described embodiment, a molded array-type transfer molding process is used.

Resin is applied over the top side of the lead frame in the region 22 so as to embed the semiconductor chips, pads and wires. Migration of resin to the underside of the lead frame 20 is prevented. The resin migrates into the recesses 25 and is solidified during a curing process. Because of the configuration of the recesses 25, withdrawal of the solidified resin is prohibited. As a result, the solidified resin within the recesses 25 effectively becomes anchored to each of the devices.

After the caps 22 have been formed, the coverlay on the back surface of the substrate 20 is removed to expose the backside of bond pads and die pads as illustrated in FIG. 1. In step 5 the exposed surfaces of the leadframe, including the exposed second surfaces of the die pad and leads, one plated with a metal, such as copper, gold, lead-tin solder, tin, nickel, palladium, or any solderable metal. Depending on the application and the material used for making the leadframe, step 5 may be omitted.

In step 6 a completed package is severed from the encapsulated leadframe. In particular, step 6 obliterates the disposable portions of the leadframe and/or severs the disposable portions of the leadframe 24, such as the rectangular frame, from the non-disposable components of the leadframe, such as the die pad and leads. Depending on the encapsulation method used in step 4, step 6 also may cut the encapsulant material to form peripheral sides of the package.

Preferably a saw is used to cut lengthwise along the saw troughs (saw pits).

Orthogonal cuts are made to singulate individual semiconductor devices.

During the singulation process, a cutting blade of a fixed width W is used to cut into the QFN matrix leadframe 20 and the encapsulation body 19 along the crosswise singulation lines and lengthwise singulation lines, for the purpose of singulating the combined batch of QFN package units constructed together on the QFN matrix leadframe 20 into individual ones. As further shown in FIG. 1, the cutting by the sawing blade is carried out all the way into the QFN matrix.

By performing this cutting process step, the end faces of the die pads and bond pads cut off are substantially flush with the side faces of the resin encapsulant 19. That is to say, this structure does not include any outer leads, which are ordinarily provided as external terminals. Instead, solder ball electrodes may be provided for this structure as alternative external terminals under the external electrodes, which are respective exposed lower parts of the bond pads and die pads that are not covered with the resin encapsulant 19. In individual cases, a solder plating layer is sometimes formed in place of the solder balls.

The invention claimed is:

1. A quad flat non-leaded semiconductor package device comprising:
   a discrete semiconductor die;
   a die pad having a first lateral surface for supporting the semiconductor die; and
   a plurality of vertical surfaces that are perpendicular to the first lateral surface, at least one bond pad having a first lateral surface and a plurality of vertical surfaces that are perpendicular to the first lateral surface;
   at least one bond wire for connecting the discrete semiconductor die to the bond pad; and
   an encapsulant for completely encapsulating the die, die pad, bond wire and bond pad having lateral and vertical outer surfaces, wherein the die pad is disposed at the perimeter of the encapsulant and partially exposed to one vertical outer surface of the encapsulant.

2. A quad flat non-leaded semiconductor package device according to claim 1, wherein a vertical surface of the die pad is provided with interlocking means.

3. A quad flat non-leaded semiconductor package device according to claim 1, wherein a vertical surface of the die pad is provided with means for interlocking the die pad vertically and laterally.

4. A quad flat non-leaded semiconductor package device according to claim 1, wherein a first and a second vertical surface of at least one pad is provided with interlocking means.

5. A quad flat non-leaded semiconductor package device according to claim 1, wherein a vertical surface of a bond pad is provided with interlocking means.

* * * * *